United States Patent [19]

Choi

[11] Patent Number: 5,278,427
[45] Date of Patent: Jan. 11, 1994

[54] QUANTUM COLLECTOR HOT-ELECTRON TRANSISTOR

[75] Inventor: Kwong-Kit Choi, Tinton Falls, N.J.

[73] Assignee: The United States of America as represented by the Secretary of the Army, Washington, D.C.

[21] Appl. No.: 13,608

[22] Filed: Feb. 4, 1993

[51] Int. Cl.$^5$ .......................................... H01L 29/161
[52] U.S. Cl. ........................................ 257/17; 257/26; 257/197; 257/198; 257/22
[58] Field of Search ................ 257/26, 197, 23, 22, 257/17, 198

[56] References Cited

U.S. PATENT DOCUMENTS 4,878,095 10/1989 Bending et al. .................. 257/26 X
4,922,314 5/1990 Shannon ............................... 257/26

FOREIGN PATENT DOCUMENTS 1-093166 4/1989 Japan ..................................... 257/26

OTHER PUBLICATIONS

Capasso et al., "Resonant Tunneling Spectroscopy of Hot Minority Electrons Injected in Gallium Arsenide Quantum Wells", *Appl. Phys. Lett.*, vol. 50, No. 14, Apr. 6, 1987, pp. 930–932.

"Quantum Transport and Phonon Emission of Nonequilibrium Hot Electrons", K. K. Choi et al., Physical Review B, vol. 41, No. 14, May 15, 1990, pp. 10250–10253.

*Primary Examiner*—William Mintel
*Attorney, Agent, or Firm*—Michael Zelenka; William A. Anderson

[57] ABSTRACT

A high-speed semiconductor device which comprises an emitter layer, a base layer, a collector layer, a potential barrier layer disposed between the emitter layer and the base layer, and a superlattice disposed between the base layer and the collector layer. The superlattice provides a multitude of quantum-mechanical transmission coefficients which can be applied to linear analog circuits and high frequency circuit. In addition, the high speed semiconductor device may act as a frequency multiplier, providing an output signal having 2n times as many frequencies as an input signal when n is the number of energy pass bands in said superlattice below a predetermined applied voltage.

12 Claims, 9 Drawing Sheets

QUANTUM COLLECTOR HOT-ELECTRON TRANSISTOR

GOVERNMENT INTEREST

The invention described herein may be manufactured, used, and licensed by or for the Government of the United States of America for governmental purposes without the payment to me of any royalties thereon.

FIELD OF INVENTION

The present invention relates in general to high-speed semiconductor devices and, more particularly, to hot-electron transistors.

BACKGROUND OF THE INVENTION

Hot-electron transistor designs have evolved over the past two decades. An example of an early design of a hot-electron transistor is dislcosed in U.S. Pat. No. 4,616,241, entitled, "High-Speed Semiconductor Device", and issued to Naoki Yokoyama. The structural elements which generally define these hot electron transistors are an emitter layer, a base layer, a collector layer, an emitter potential barrier layer disposed between the emitter layer and the base layer, and a collector potential barrier disposed between the base layer and the collector layer.

In operation, a voltage bias is applied between the emitter and the base. The function of the emitter potential barrier is to limit the amount of emitter current at a given emitter voltage. By adjusting either the thickness or the height of the emitter barrier, the desirable emitter current level can be obtained. A low emitter barrier allows high energy electrons to penetrate the base while filtering out lower energy electrons, thereby limiting the current penetrating into the base. On the other hand, a high barrier inhibits tunneling of electrons. Once the high energy or "hot electrons" (herein defined as thermally non-equilibrium electrons) penetrate the emitter barrier, these electrons gain energy from the applied electric field and travel through the base to reach the collector potential barrier.

Heretofore, it has been generally assumed that the transmission coefficient of the electrons through the barrier is zero when the hot-electron energy is less than the collector potential barrier height and equal to one if the hot-electron energy is higher than the collector barrier height. This assumption concerning the basic operation of the device, however, is based on the theory that the hot-electrons experience both elastic and inelastic scatterings in the base and therefore, the propagation of hot-electrons does not exhibit quantum-mechanical characteristics. If this is the case, the phases of the hot-electrons will become incoherent and the subsequent motion of the hot-electron will be characterized by uncorrelated phases. Accordingly, prior art designs of collector potential barriers ignored the wave nature of the electrons. As a consequence, the collector potential barrier in previous designs have conventionally been made of a single material layer which serves as an electron energy filter. (See Yokoyama, U.S. Pat. No. 4,616,241).

The conduction-energy-band diagram for a prior art hot-electron transistor device is illustrated in FIG. 1 wherein the emitter to base voltage is labeled $V_{eb}$. This figure illustrates the relationship among the essential structural elements of a hot-electron transistor which include: emitter 1, base 3, collector 5, and two potential barriers, an emitter potential barrier 2 (EPB) and a collector potential barrier 4 (CPB) 4. It should be noted that in this diagram the thermal electrons are assumed to follow a Boltzman distribution whereas the high-energy hot-electrons follow the distribution curve shown in FIG. 1. An important feature of prior art hot-electron transistors, as noted above, is that the collector potential barrier is composed of a one material layer. Thus, only the electrons with energy higher than the barrier height of the filter could overcome the barrier and be collected in the collector. The electrons with lower energy, however, would be blocked by the filter and drained through the base.

FIG. 2 is a graph of the current transfer ratio versus the emitter to base voltage of the hot-electron transistor previously described. It should be noted that a similar graph results from all prior art designs. The current transfer ratio is defined as $I_c/I_E$, where $I_c$ is the electron current flowing out of the collector and $I_E$ is the electron current flowing into the emitter. The current transfer ratio is measured under the condition that the emitter bias $V_{eb}$ is increased while the collector to base bias $V_{cb}$ is kept constant. As the emitter bias increases, the energy of the hot-electrons injected into the base increases. The portion of the hot-electrons that can overcome the collector potential barrier after traversing through the base will also increase. As a result, the current transfer ratio increases steadily with an increase in emitter bias for a large range of emitter bias.

Those skilled in the art know, however, that there are small oscillatory features superimposed on this smoothly rising background. These oscillations are demonstrated by a graph of the quantum-mechanical transmission coefficient of the collector potential barrier, as shown in FIG. 3. Here, FIG. 3 shows the oscillatory features of the transmission coefficient above the potential barrier height, which is 165 meV in this example. This may be compared to the transmission coefficient of unity above the collector potential barrier height and zero below it. Thus, it is the quantum mechanical oscillations of the transmission coefficient which explain the oscillatory structures on the graph of the current transfer ratio. These oscillations, however, eliminate the possibility of providing for a constant increase in the current transfer ratio over a range of voltages. Despite this disadvantage, these oscillations were ignored in prior art hot-electron transistor designs. The present invention addresses this problem.

SUMMARY OF THE INVENTION

Accordingly, it is an object of the present invention to provide a semiconductor device which maximizes the emitter to collector hot-electron transfer ratio in order to maximize the frequency of operation or, in other words, the speed of the device.

It is another object of the present invention to provide a semiconductor device with improved transistor current amplification.

It is another object of the present invention to provide a semiconductor device which permits current-voltage characteristics suitable for both digital and analog operation.

It is another object of the present invention to provide a semiconductor device which has an output signal frequency which is a multiple of the input signal.

These and other objects and features of the present invention are accomplished by providing a hot-electron transistor with a collector potential barrier which is composed of multiple layers. Specifically, the collector potential barrier includes at least one set of quantum-well forming regions, each region having thin potential barrier layers and a thin quantum-well layer between the potential barrier layers. As anticipated by the present invention, the superlattice may include a plurality of sets of quantum well forming layers which are stack-formed with a periodic structure.

The collector potential barrier according to the present invention is engineered so as to permit quantum mechanical transmission of current from the base into the collector region due to a self-interference effect of the electrons. When quantum-mechanical transmission occurs, the transmission coefficient (herein defined as probability of transmission) achieves a maximum for one or more energy ranges of the electrons. These energy ranges may be above or below the collector potential barrier height. The existence of energy ranges during which the emitter to collector current transfer ratio is a constant allows for linear operation for a given input emitter voltage.

In addition, the device may also be utilized in circuits for the purpose of achieving frequency multiplication. For the input waveform in a circuit designed for frequency multiplication, the voltage varies through one cycle while the output varies through multiple cycles due to the quantum mechanical transmission effect.

DETAILED DESCRIPTION OF THE DRAWINGS

Contrary to the assumptions made in designing prior art hot electron transistors, "Quantum Transport and Phonon Emission of Nonequilibrium Hot Electrons," K. K. Choi et al, Physical Review B, V. 41, pp. 10250, 1990, which is incorporated herein by reference hereto, discloses that there is a coherent transmission of electrons through a potential barrier. Thus, the subsequent motion of hot-electrons exhibits quantum-mechanical interference as long as the electrons inside the collector potential barrier do not experience additional scatterings. This phenomenon is based on a single electron self-interference effect analogous to single photon self-interference.

The present invention utilizes this effect in order to produce a hot-electron transistor which has an improved current voltage characteristic over prior art designs. The collector potential barrier, according to the present invention, is engineered to have a transmission coefficient of unity for a particular energy range or set of ranges either above or below the collector potential barrier height. This results in a semiconductor device which may operate in both digital or analog mode and which allows for outputting a multiplied frequency signal for an AC input signal.

Figure 4:
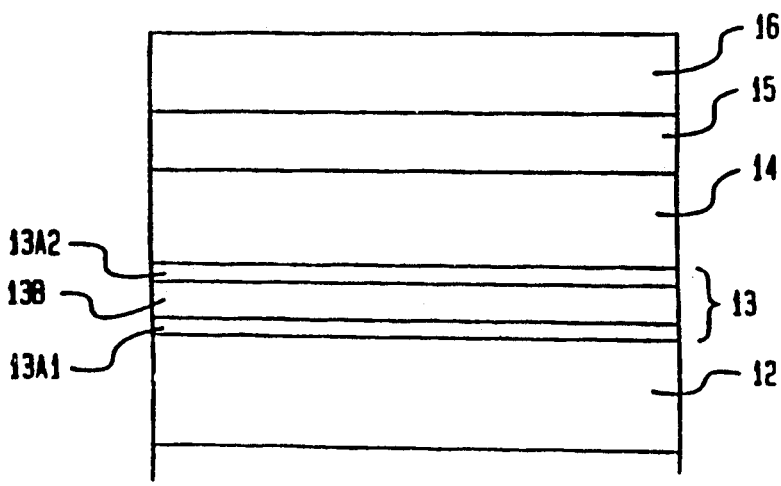
FIG. 4 is a sectional view of the semiconductor superlattice heteroststructure according to an embodiment of the present invention.

Now referring to FIG. 4, there is shown a superlattice heterostructure according to the present invention which includes a semi-insulating GaAs substrate 11, an n-type GaAs collector contact layer 12, an undoped superlattice collector potential barrier layer 13, an n-type GaAs base layer 14, an undoped $Al_{0.35}Ga_{0.65}As$ emitter potential barrier layer 15, and a n-type emitter contact layer 16. The collector potential barrier 13 itself is a superlattice which includes at least one quantum well forming region that may be formed from undoped $Al_{0.35}Ga_{0.65}As$ layers 13A1 and 13A2 and an undoped GaAs layer 13B disposed between the undoped $Al_{0.35}Ga_{0.65}As$ layers 13A1 and 13A2. As shown, collector potential barrier 13 is disposed between the base layer 14 and the collector layer 12 instead of the undoped AlGaAs potential barrier layer 4 in the prior art mentioned above.

Figure 5:
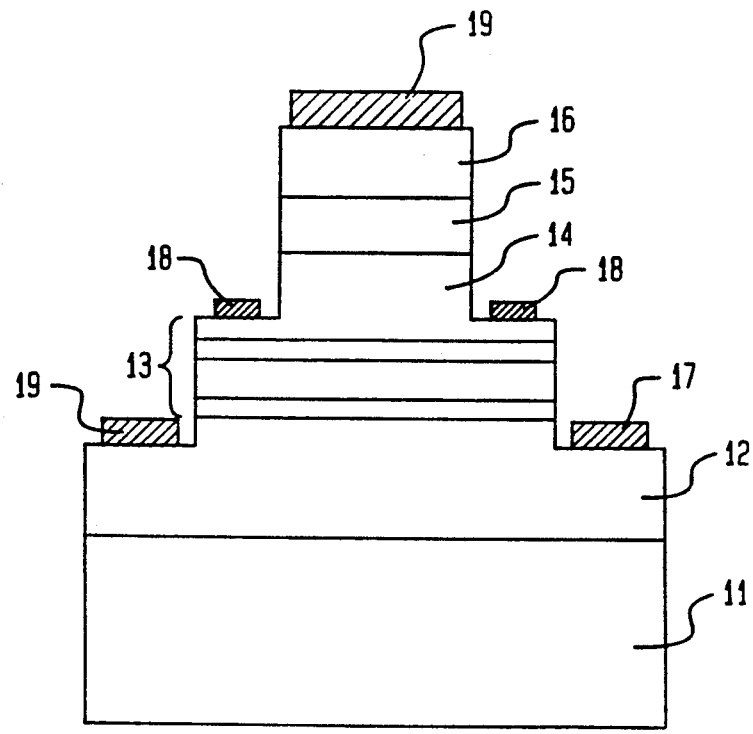
FIG. 5 is a sectional view of a hot-electron transistor device according to the present invention.

FIG. 5 illustrates a completed hot electron transistor. The device shown may be fabricated utilizing commonly known photolithography techniques to mesa-etch the heterostructure of FIG. 4 to expose both the collector layer 12 and the base layer 14, as shown. Then, the collector electrodes 17, base electrode 18 and emitter electrode 19 may be deposited where shown utilizing known vapor deposition techniques.

In operation, a voltage bias is applied between the emitter and the base via emitter and base electrodes 19 and 18, respectively. As stated previously, the function of the emitter potential barrier is to limit the amount of emitter current at a given emitter voltage. By adjusting either the thickness or the height of the emitter barrier, the desirable emitter current level can be obtained. Once the hot electrons penetrate the emitter barrier, these electrons gain energy from the applied electric field and travel through the base to reach the collector potential barrier.

Figure 1:
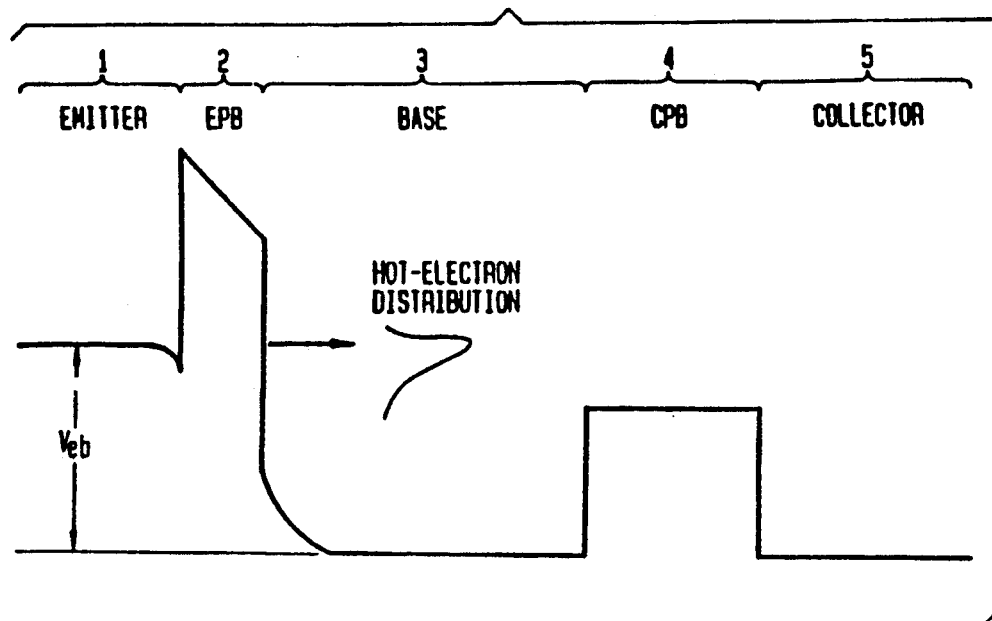
FIG. 1 is a conduction-energy-band diagram of a prior art hot-electron transistor device.
Figure 2:
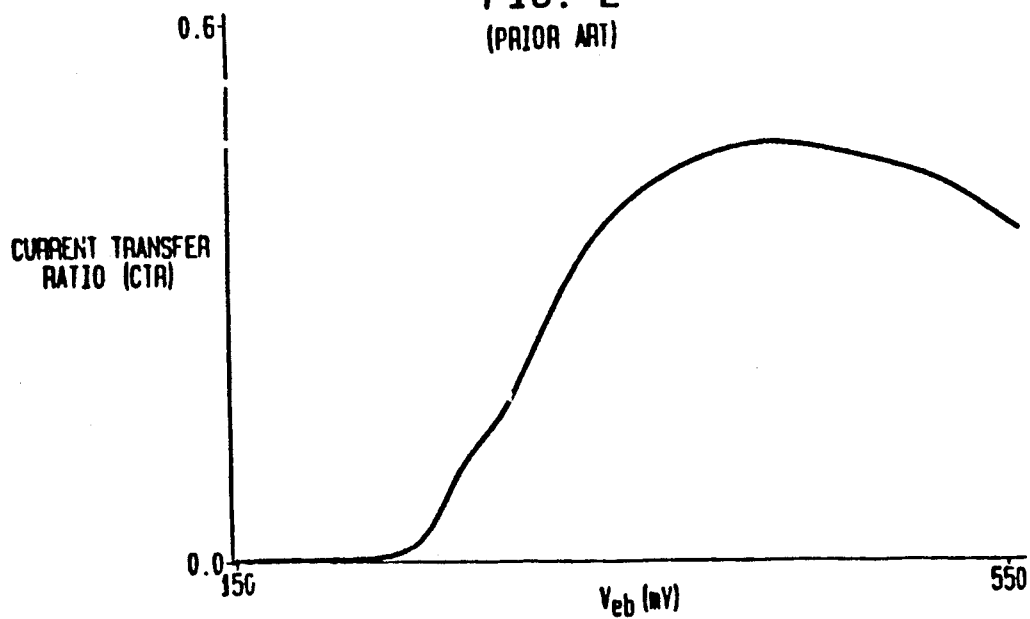
FIG. 2 is a graph of the experimental current transfer ratio as a function of emitter to base voltage of a prior art hot-electron transistor device.
Figure 3:
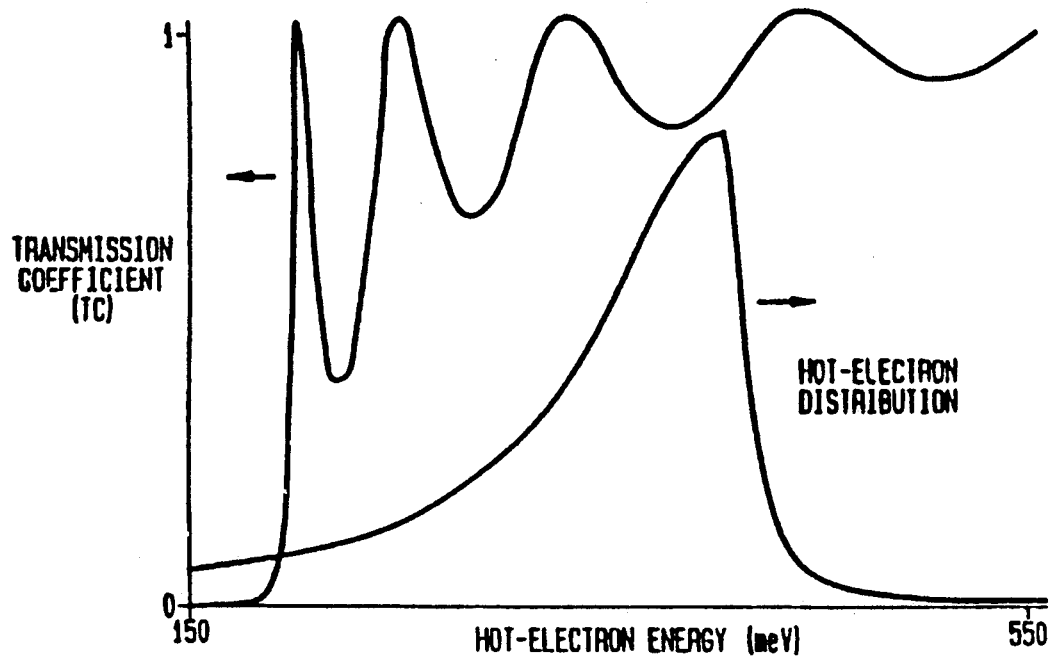
FIG. 3 is a graph of the transmission coefficient of the collector potential barrier and the hot-electron distribution in the base at a particular emitter to base voltage of a prior art hot-electron transistor.
Figure 6:
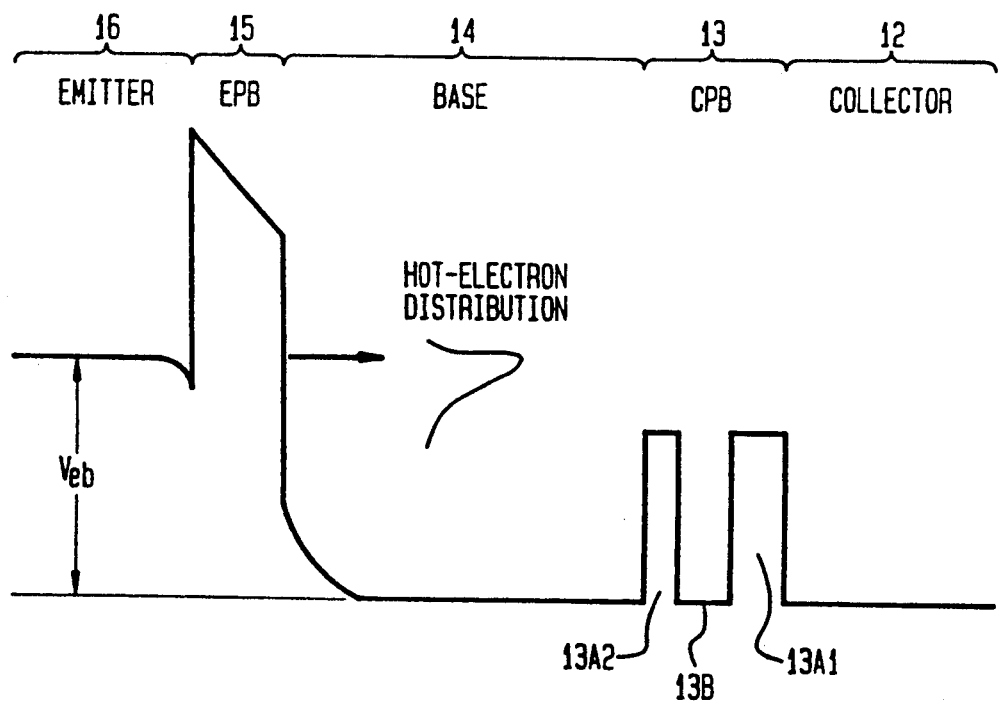
FIG. 6 is a conduction energy band diagram of the heterostructure shown in FIG. 4.
Figure 7:
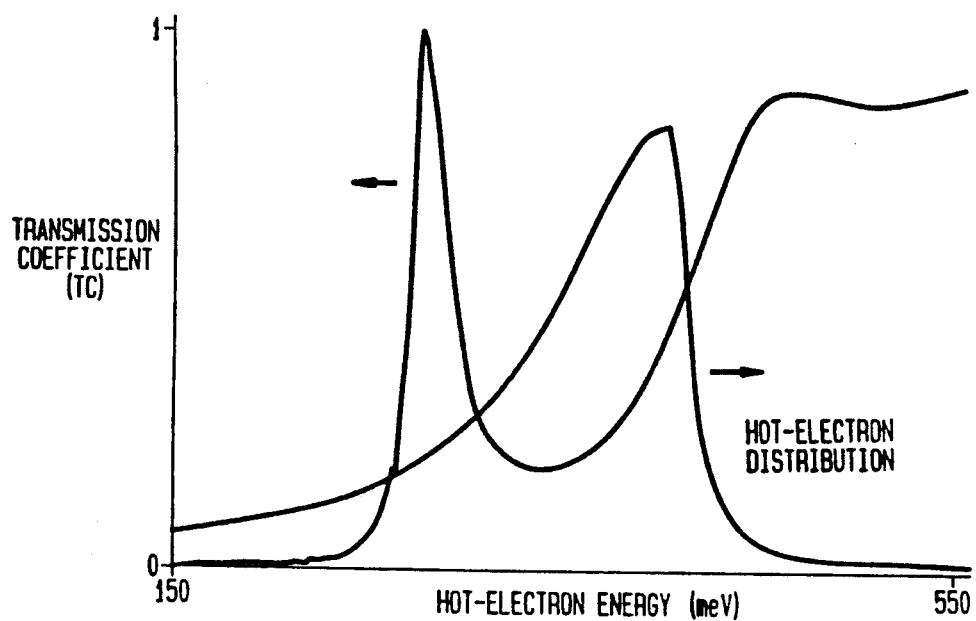
FIG. 7 is a graph of the transmission coefficient of the collector potential barrier and the hot-electron distribution at a particular emitter to base voltage in the base of the heterostructure shown in FIG. 4.

FIG. 6 illustrates the conduction energy band diagram of the heterostructure of FIG. 4. As compared to the prior art, the distribution of hot electrons follows a more consistent path over the collector potential barrier. This is illustrated in FIG. 7, wherein there is shown a large difference in the quantum-mechanical transmission coefficient in the energy range of 150 meV to 550 meV as compared to the prior art shown in FIG. 3.

Figure 8:
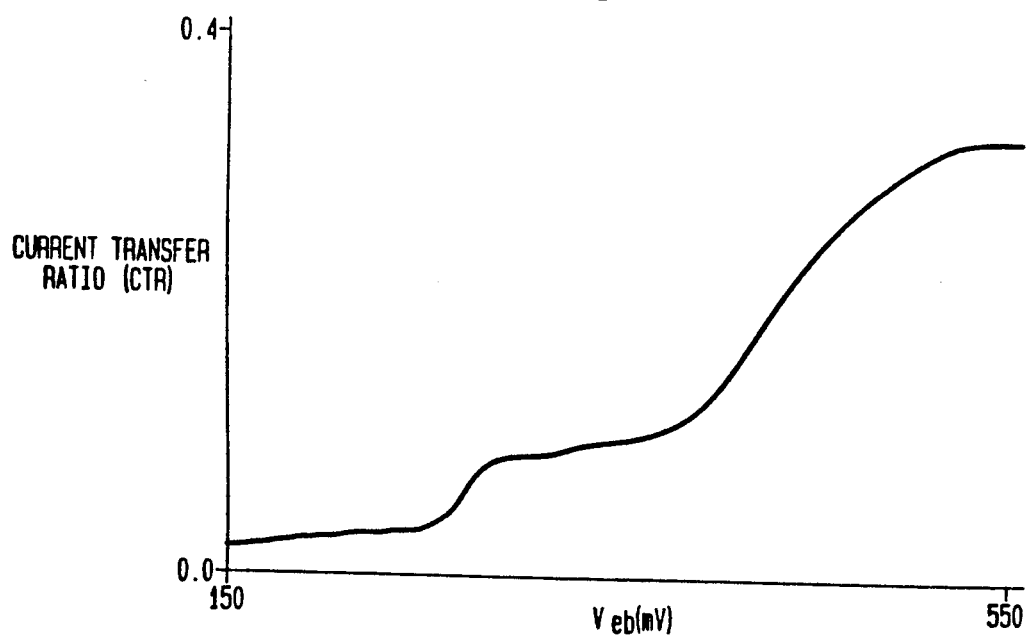
FIG. 8 is a graph of the experimental current transfer ratio as a function of emitter to base voltage of the heterostructure shown in FIG. 4.

This difference, then, gives rise to a completely different current transfer ratio which can be useful in the design of the device in analog circuit applications. The current transfer ratio is the ratio of the collector current over the emitter current; the current transfer ratio is also equal to the product of the hot-electron distribution times the transmission coefficient. As illustrated in FIG. 8, the occurrence of a plateau region in a graph of the current transfer ratio between 270 mV and 350 mV of the applied voltage is due to the existence of a broad transmission minimum in the energy range of 270 meV and 350 meV. Therefore, if the transmission coefficient is a constant within a range of energy, then the current transfer ratio will remain constant in that particular range of energy. Correspondingly, the collector current as the output signal and the emitter current will bear a constant ratio within that particular range of energy or emitter voltage. Therefore, the output signal will vary linearly with the input signal within that range emitter voltage. This linear characteristic is useful in many analog applications such as in many audio and video systems because an important feature of transistors in these systems is to provide a constant or nearly constant transmission coefficient in a desired range of energy. Utilizing the present invention, therefore, the thickness of the collector potential barrier and the number of quantum wells in the collector potential barrier can be engineered to provide the needed constant transmission coefficients.

As those skilled in the art will readily appreciate, the heterostructure shown in FIG. 4 may be fabricated by well known methods of molecular beam epitaxy or any other known epitaxy methods. Further, those skilled in the art will also appreciate that the structures described herein may be fabricated from other III-V semiconductor materials other than GaAs and AlGaAs, such as InAs, InGaAs, and InP. Similarly, the collector, base and emitter layers may be made of p-doped materials instead of n-doped materials. The difference, of course, being that the current carriers would be holes rather than electrons.

Figure 9:
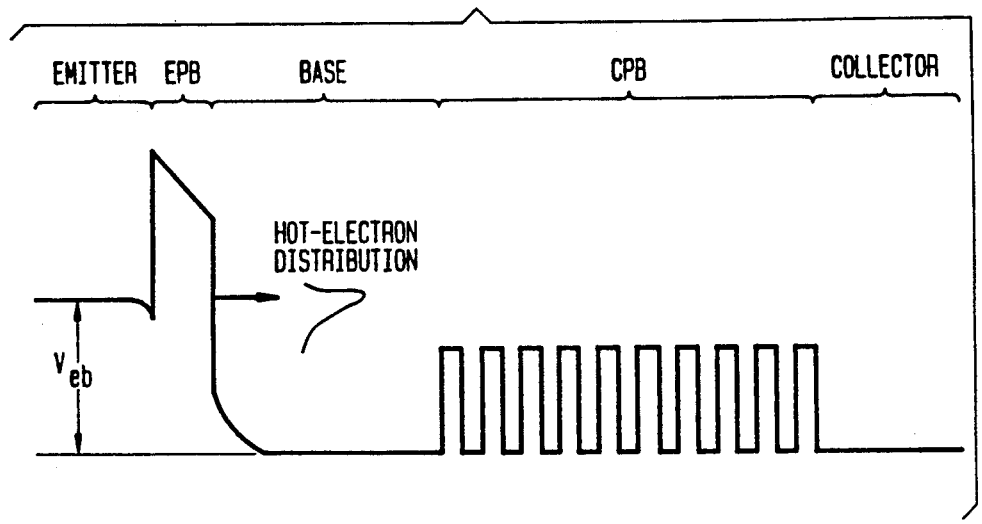
FIG. 9 is a conduction energy band diagram of the hot-electron transistor device used for maximizing the current transfer ratio.
Figure 10:
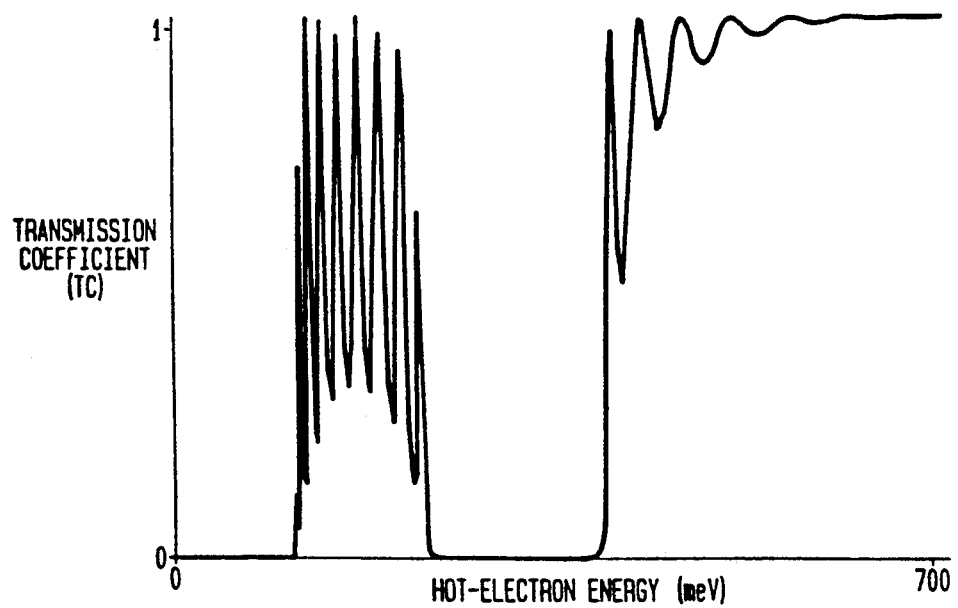
FIG. 10 is a graph of the transmission coefficient of the collector potential barrier for the hot-electron transistor shown in FIG. 9.
Figure 11:
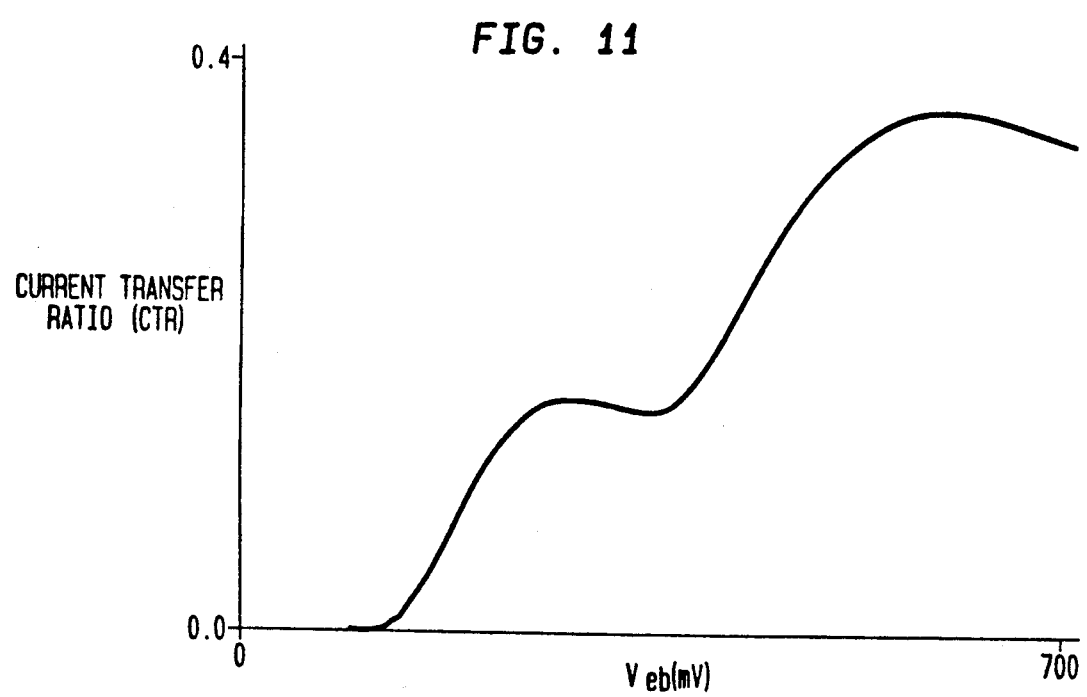
FIG. 11 is a graph of the experimental current transfer ratio as a function of emitter to base voltage of the hot-electron transistor shown in FIG. 9.
Figure 14:
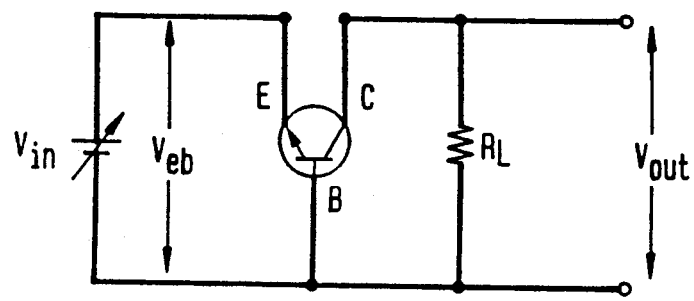
FIG. 14 is a schematic illustration of the electrical circuit for frequency multiplication.

Another variation in the design of the present invention also would improve the speed of the device. Maximizing the number of electrons being collected at the collector would yield a high speed device. FIG. 9 is the conduction energy band diagram of another variation of the present invention which maximizes the speed of the device. It differs from the previous design of FIG. 4 only in the collector potential barrier structure. The collector potential barrier in this case consists of ten periods of undoped 30-Å-thick $Al_{0.27}Ga_{0.73}As$ barrier layers and 20-Å-thick GaAs well layers. With this collector potential barrier structure, the calculated transmission coefficient is shown in FIG. 10. There are two energy bands at which the transmission coefficient is appreciable: one at 100 meV to 200 meV, the other is above 400 meV. At these energy ranges, the hot-electrons are most easily passed through the collector barrier and collected in the collector layer. Hence, the current transfer ratio can be maximized at emitter to base voltages of 250 mV and 600 mV. The experimental current transfer ratio is shown in FIG. 14. The two maxima of the current transfer ratios are observed at $V_{eb}$ equal to 250 mV and 650 mV, which is consistent with the teachings of the present invention. The result shows that the design can be used to maximize the current transfer ratio at any voltage range. This results in a maximum number of electrons being collected in the collector layer which yields a high speed device design.

Figure 12:
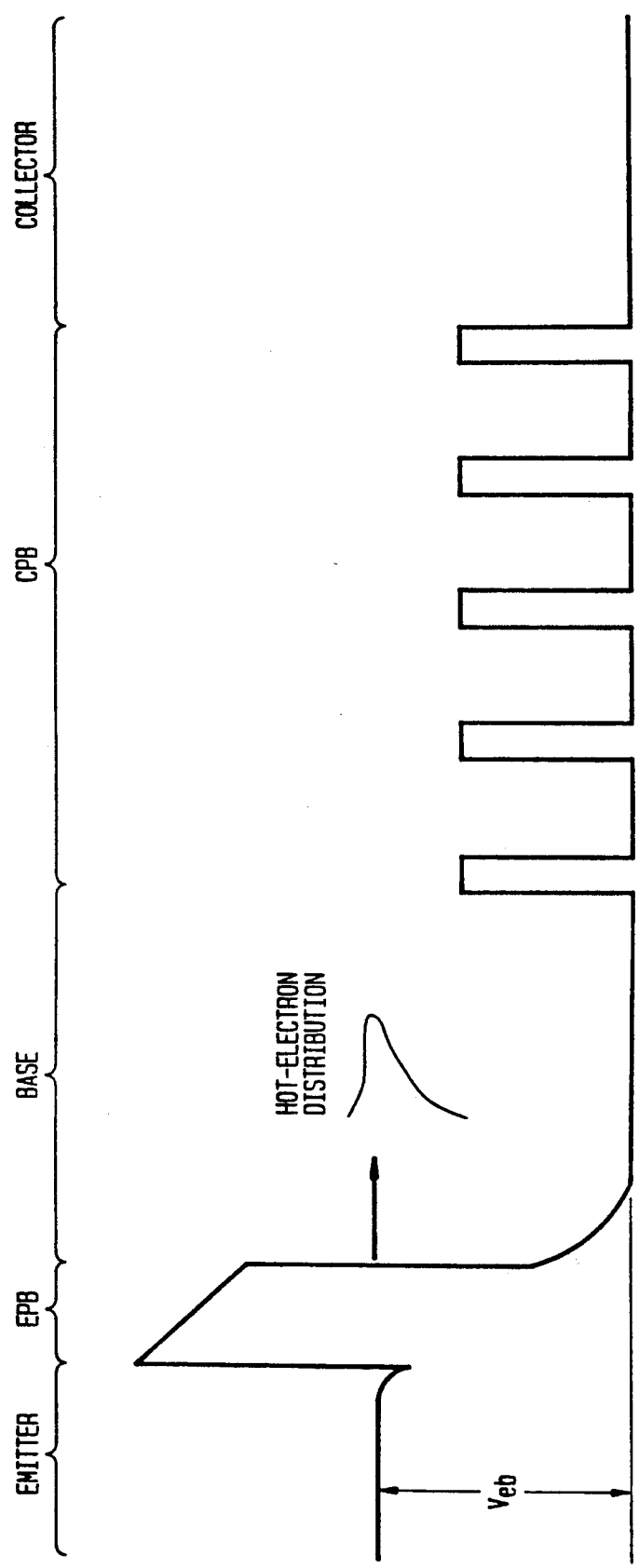
FIG. 12 is a conduction energy band diagram of the hot-electron transistor device used for frequency multiplication.
Figure 13:
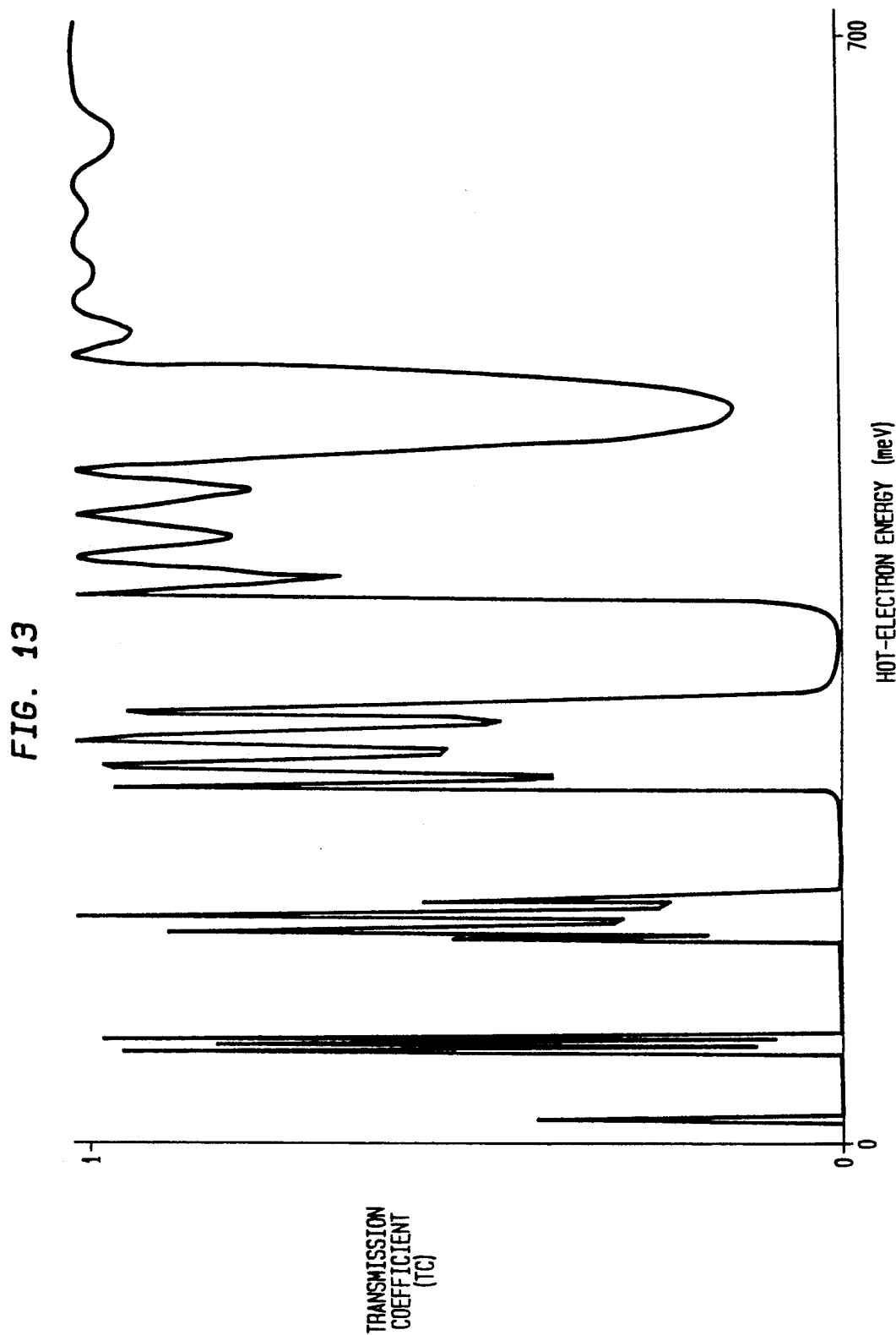
FIG. 13 is a graph of the transmission coefficient of the collector potential barrier for the hot-electron transistor shown in FIG. 12.

FIG. 12 shows the energy band diagram of a frequency multiplier transistor design. It also differs from the previous design of FIG. 4 only in a change of the collector potential barrier. The collector potential barrier for this application consists of five periods of undoped 30-Å-thick $Al_{0.27}Ga_{0.73}As$ barrier layers and 150-Å-thick GaAs well layers. The calculated transmission coefficient for this collector potential barrier is shown in FIG. 13. As shown, there are five energy pass bands below 455 meV at which the transmission coefficients are appreciable. Within each energy pass band, the hot-electrons are relatively free to pass through the collector barrier and to be collected in the collector layer. Outside these energy pass bands, the hot electrons are blocked by the collector potential barrier and are drained out through the base. Therefore, the current transfer ratio will increase within the energy pass band and decrease outside the energy pass band. If the applied voltage $V_{eb}$ increases from 0 mV up to 455 mV and then decreases to 0 mV to complete one oscillation cycle, then the current transfer ratio will increase from zero at zero volts and go through a maximum at each energy pass band and decrease again outside each of these energy pass bands. Hence, the current transfer ratio will go through ten oscillations for one oscillation in the $V_{eb}$. Therefore, the device may act as a frequency multiplier.

Figure 15:
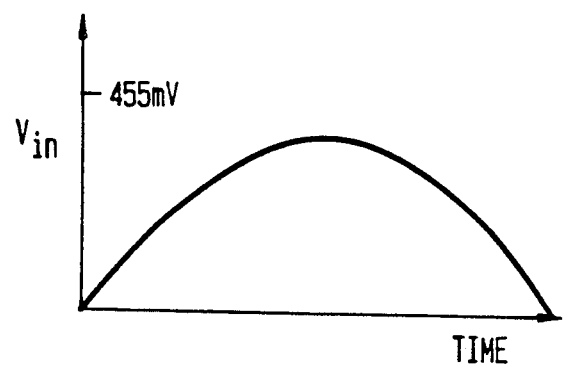
FIG. 15 is a graph of the input waveform as a function of time of the electrical circuit for frequency multiplication shown in FIG. 14.
Figure 16:
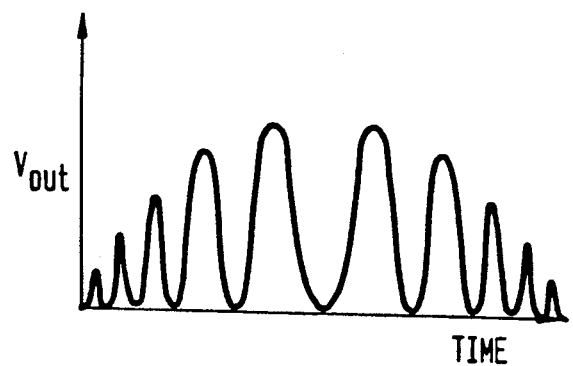
FIG. 16 is a graph of the corresponding output waveform as a function of time of the electrical circuit for frequency multiplication shown in FIG. 14.

The electrical circuit for such a frequency multiplication device is shown in FIG. 14. A variable input voltage $V_{in}$ is applied to the emitter e and a bias voltage $V_{eb}$ is applied across the emitter e and base b. A load resistance is coupled across the base b and collector c. The input waveform and the corresponding output waveform as a function of time are shown in FIGS. 15 and 16. As shown, for one cycle of input voltage from 0 to 455 mV to 0, the output voltage goes through ten cycles and thus, the frequency has been multiplied by a factor of ten.

According to the present invention, desirable device characteristics can be designed by varying the number of periods of the quantum-well layer and the quantum-barrier layer in the collector potential barrier structure. If the number of periods is small, such as two in the device shown in FIG. 4, the transmission coefficient between the energy pass bands is low but still appreciable. Therefore, as explained above, a plateau region in the current transfer ratio is observed when the hot-electron energy falls between these two energy pass bands. If the number of periods increases, the transmission coefficient outside the energy pass bands is suppressed to a larger extent. Consequently, there will be a dip in the current transfer ratio between the energy pass bands. The dip will be larger with more periods of material layers in the collector potential barrier. Therefore, different device characteristics can be obtained by using a different number of periods of semiconductor material in the collector potential barrier.

Other and different approximations to the quantum collector hot-electron transistor may occur to those skilled in the art. Accordingly, having shown and described what is at present considered to be a set of three preferred embodiments of the invention, it should be understood that the same has been shown by way of illustration and not limitation. And all modifications, alterations, and changes coming within the spirit and scope of the invention are herein meant to be included.

I claim:

1. A three terminal hot-electron transistor comprising:
   a substrate;
   an emitter layer;
   a doped base layer;
   a first potential barrier disposed between the emitter layer and the base layer;
   a collector layer disposed on the substrate;
   a second undoped potential barrier disposed between the base layer and the collector layer, the second potential barrier having at least one set of quantum well forming regions and having a stoichiometry and dimensions such that a constant transmission coefficient is established;
   a variable voltage input means electrically connected to the emitter layer; and
   a bias voltage means electrically connected across the collector and base layers, the bias voltage means providing a constant voltage;
   wherein the substrate, the emitter layer, the base layer, the collector layer and the first and second potential barriers are formed from III-V semiconductor material.

2. The hot-electron transistor of claim 1 wherein the dopants of the semiconductor material comprising the transistor and the widths of the emitter layer, the base layer, the collector layer, and the first and second potential barriers are predetermined such that the current transfer ratio is constant over a predetermined voltage range.

3. The hot-electron transistor of claim 2 wherein the dopants of the semiconductor material comprising the transistor and the widths of the emitter layer, the base layer, the collector layer, and the first and second potential barriers are predetermined such that the current transfer ratio is maximized for a predetermined voltage range.

4. The hot-electron transistor of claim 2 wherein the emitter layer, the base layer, the collector layer are all n doped.

5. The hot-electron transistor of claim 2 wherein the emitter layer, the base layer, the collector layer are all p doped.

6. The hot-electron transistor of claim 1 wherein the second potential barrier is formed of a plurality of alternating thin layers of GaAs and AlGaAs.

7. The hot-electron transistor of claim 1 further comprising electrodes deposited on the emitter layer, on one side of the collector layer and on one side of the base layer.

8. A three-terminal frequency multiplication device comprising:
   a substrate;
   an emitter layer;
   a doped base layer;
   a first potential barrier disposed between the emitter layer and the base layer;
   a collector layer disposed on the substrate;
   a second undoped potential barrier disposed between the base layer and the collector layer, the second potential barrier having at least one set of quantum well forming regions and having a stoichiometry and dimensions such that a constant transmission coefficient is established;
   a variable voltage input means electrically connected to the emitter layer; and
   a bias voltage means electrically connected across the collector and base layers, the bias voltage means providing a constant voltage;
   wherein the substrate, the emitter layer, the base layer, the collector layer, and the first and second potential barriers are formed from III-V semiconductor material.

9. The frequency multiplication device of claim 8 wherein the emitter layer, the base layer, the collector layer are all n doped.

10. The frequency multiplication device of claim 8 wherein the emitter layer, the base layer, the collector layer are all p doped.

11. The frequency multiplication device of claim 8 wherein the second potential barrier is formed of a plurality of alternating thin layers of GaAs and AlGaAs.

12. The frequency multiplication device of claim 8 further comprising electrodes deposited on the emitter layer, on one side of the collector layer and on one side of the base layer.

* * * * *